United States Patent [19]

Beck

[11] 4,199,730
[45] Apr. 22, 1980

[54] DOUBLE PEAKED AMPLIFIER

[75] Inventor: Virgil R. Beck, Elmhurst, Ill.

[73] Assignee: The United States of America as represented by the Secretary of the Army, Washington, D.C.

[21] Appl. No.: 118,420

[22] Filed: Sep. 28, 1949

[51] Int. Cl.$^2$ .......................... H03F 1/36; H03F 1/00
[52] U.S. Cl. .................................. 330/109; 330/176; 102/214
[58] Field of Search .......... 179/171.1, 171.2, 171.3 A; 178/44.21; 330/109, 176

[56] References Cited

U.S. PATENT DOCUMENTS

| | | | |
|---|---|---|---|
| 1,956,964 | 5/1934 | Schaffer | 197/171 |
| 1,981,071 | 11/1934 | Roberts | 179/171.1 |
| 2,084,475 | 6/1937 | Braden | 179/171.1 |
| 2,139,916 | 12/1938 | Seeley | 179/171.3 |
| 2,173,427 | 9/1939 | Scott | 178/44.21 |
| 2,178,072 | 10/1939 | Fritzinger | 178/44.21 |
| 2,218,399 | 10/1940 | Le Bell | 178/44.9 |
| 2,245,365 | 6/1941 | Riddle | 179/171.3 A |
| 2,272,589 | 2/1942 | Steinmetz | 179/171.2 |
| 2,285,832 | 6/1942 | Perkins | 179/171.7 |
| 2,289,752 | 7/1942 | Bruck et al. | 178/44.21 |
| 2,366,565 | 1/1945 | Shea et al. | 179/171.3 A |
| 2,439,245 | 4/1948 | Dunn | 179/171 |
| 2,584,386 | 2/1952 | Hare | 179/171.2 |

*Primary Examiner*—Nelson Moskowitz

*Attorney, Agent, or Firm*—Nathan Edelberg; Robert P. Gibson; Saul Elbaum

EXEMPLARY CLAIM

1. An audio frequency amplifier selectively responsive to a band of Doppler frequencies comprising an electron tube having at least grid, anode and cathode elements, a three pi network connecting said electron tube anode and grid elements, said network providing in-phase feedback producing maximum gain at peak high frequency of said Doppler band, an output circuit for said audio frequency amplifier, an input circuit for said audio frequency amplifier, a high frequency peak gain control comprising a capacitor coupling said output circuit and grid element of said electron tube, said gain control producing negative feedback and thereby controlling the high frequency peak gain of said audio frequency amplifier, an isolating resistor in series with said capacitor and said output circuit, said isolating resistor functioning to isolate said capacitor from said network so that a change in said capacitor will affect only the gain and not the peak frequency of said network, said input circuit including input terminals, a variable resistor, capacitor and inductor series connected across said input terminals, and means connecting the grid-cathode circuit of said electron tube across said inductor, whereby frequencies below the low frequency end of said band are sharply surpressed, said variable resistor being adjustable to increase the impedance of said input circuit and thereby interact with the said peak high frequency gain to increase the effectiveness of said network.

2 Claims, 3 Drawing Figures

DOUBLE PEAKED AMPLIFIER

This invention relates to a band-pass amplifier in the low audio frequency range. Such an amplifier may have general utility, but is particularly useful in connection with Doppler type radio proximity fuses or object sensing devices, where the Doppler frequency within a narrow range (e.g. 100 cycles) provides an indication of the presence of the desired object being sought or sensed.

The sensing device (e.g. a proximity fuse) includes a transmitter carrier on a projectile or other missile, in which the reflecting energy from the detected object is combined with the transmitted energy to produce a Doppler frequency which is amplified and used to operate a relay, usually of the thermionic type. Since the missile does not usually travel at constant speed, the Doppler frequency will vary with the speed of the missile—in the case of a bomb the speed will continue to increase as the bomb drops, and in the case of a fired projectile, the speed will usually decrease during the important part of the flight. It is therefore necessary to provide a range of amplification which will include any Doppler frequency which may appear in practice, but will exclude all other frequencies, both in the interest of increased efficiency and to reduce chances of incorrect response or jamming. In practice a spread in the order of about 100 cycles in the low audio frequency range is found to be required. The problem is to produce a one-tube band-pass amplifier in this range, with a voltage gain factor of at least 130, using a minimum of bulky or heavy components, because the size and weight factors consistute an obsolute limitation for the type of equipment under consideration.

I have solved this problem by a novel arrangement of elements including an input circuit having a choke and coupling condenser tuned to the low frequency end of the band which is passed, and a resistance capacity filter network connection between the anode output circuit and the grid input circuit to provide a feedback which produces a maximum gain at the high frequency end of the band, so that frequencies above and below the band frequencies diminish rapidly in gain. The choke and input condenser circuit are isolated from the grid and the resistance capacity feedback network by a resistor in series with the grid of the amplifier tube.

The specific nature of the invention as well as other objects and advantages thereof will clearly appear from a description of a preferred embodiment as shown in the accompanying drawing, in which, FIG. 1 is a schematic circuit diagram of my amplifier circuit.

Figure 1:
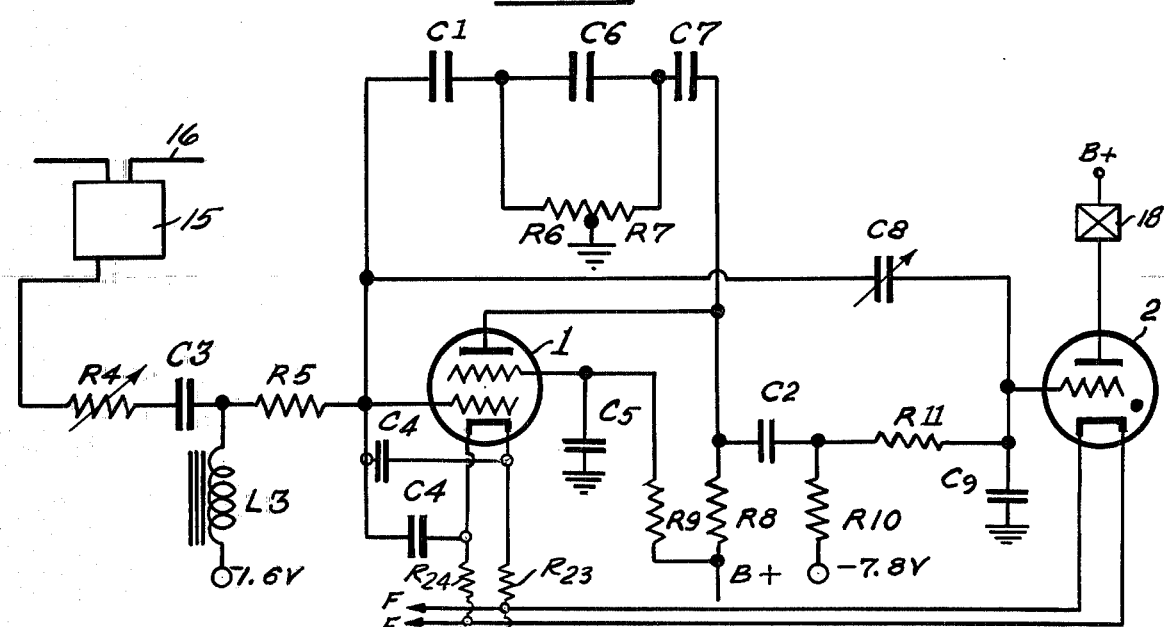

The sensing device (e.g. a proximity fuse) in which the Doppler frequencies are generated is generally indicated in FIG. 1 by the rectangular block 15 having its output coupled to the amplifier by means of variable resistor $R_4$. Numeral 16 indicates a radiation means for the sensing device.

The function to be performed by the amplifier under operating conditions requires a special selective frequency response. The amplifier must have very low grain at frequencies above the band to be passed in order to avoid difficulties with tube microphonics and generator ripple; likewise, the amplification of frequencies below this band must also be very low so that low-frequency microphonics do not interfere. At the same time, over the usable band of frequencies, the amplification must be about 130 (42 db) to give the required over-all sensitivity. With the present amplifier the band-pass region is almost 150 cycles wide and has an effective circuit Q of 1.5 in order to amplify the Doppler operating signals which may vary that amount in frequency due to variations in carrier wavelength and bomb velocities.

The foregoing requirements are met by the utilization of a tuned choke input and selective positive feedback amplifier. The necessary flat-top band-pass characteristic is obtained by the correct placing of a double peak in the frequency response. The input grid circuit is tuned to resonance at frequency A, see FIG. 2, thus providing the low-frequency peak and the required low-frequency cut. A positive feedback scheme is used to obtain the higher-frequency peak, shown at B in FIG. 2, and also provide degeneration for frequencies above B.

Figure 2:
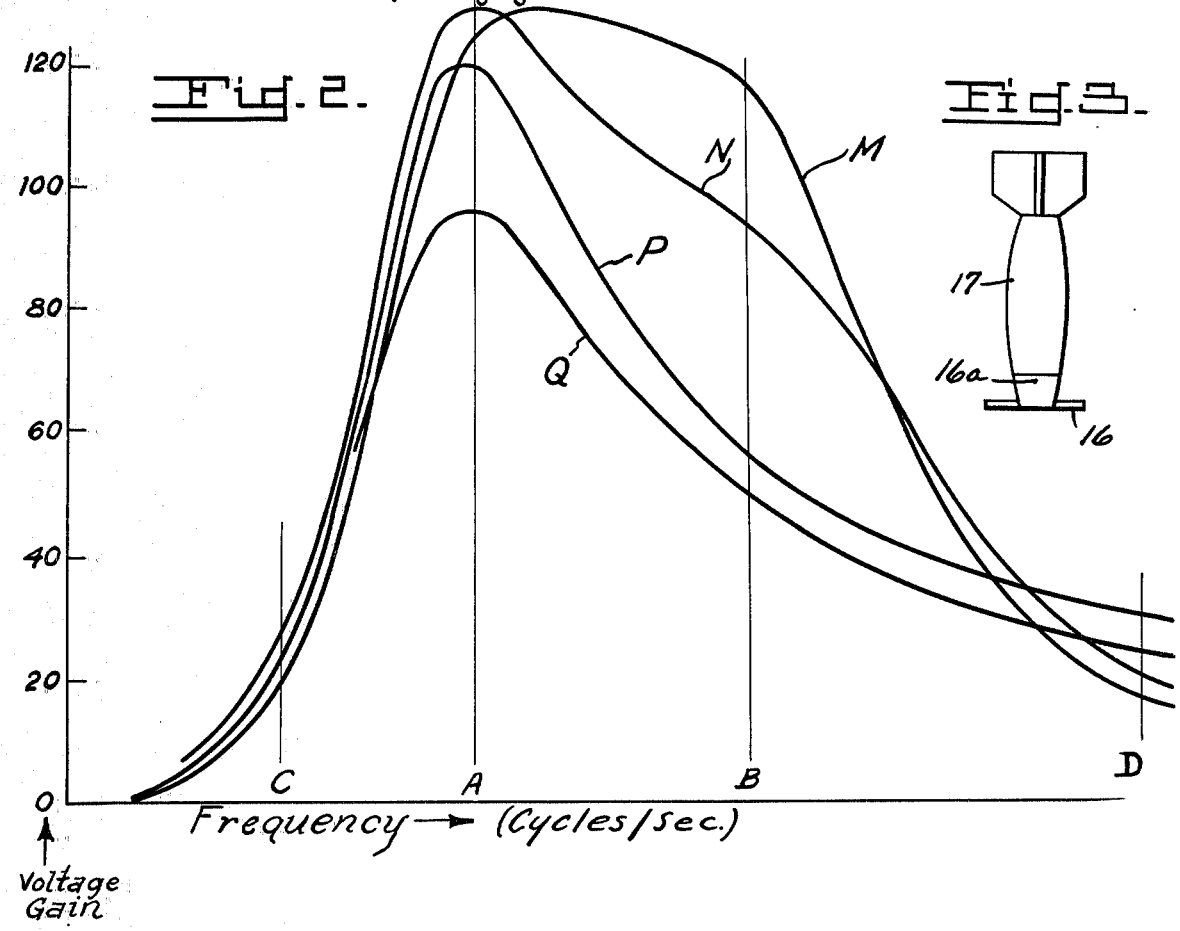
FIG. 2 is a chart showing response curves under various cards of adjustment.

FIG. 2 shown at M a curve of the typical frequency response which is obtained from the type of amplifier described in this application.

The amplifier functions in the following manner: An audio voltage generated in the sensing device generally indicated by reference numeral 15 reaches the grid of the amplifier tube by way of $R_4$, $C_3$, and $R_5$, which are all in series with the signal. The output of the amplifier appears across $R_8$, and is coupled to the thyratron grid load by $C_2$. A portion of the output is also fed back to the input through the phase-shifting network $C_7$, $R_7$, $C_6$, $R_6$, $C_1$, $R_5$, and the input circuit. The screen-grid parameters also play a part in determining the phase shift and gain. Tube 1 is shown as a tetrode, but could obviously equally well be a pentode or any other suitable amplifier tube.

It will be noted that the actual amplifier input circuit consists of $R_4$, $C_3$, $L_3$, and $R_5$. Of interest is the $L_3C_3$ combination which plays a very important part. A series-resonant circuit is formed by $C_3$ and $L_3$ with $R_4$ in series with it from the source of audio voltage. The voltage for the amplifier grid is taken off across the high-inductance choke $L_3$ through $R_5$. The resistor $R_5$ is for isolation, and also forms part of the grid impedance for the audio that is fed back from the tube plate load. The $L_3C_3$ ratio used gives the required gain at the resonant frequency of A cycles without using too large a $C_3$ condenser, since this condenser along with $R_5$ determines the feedback grid impedance and hence the effectiveness of the regenerative circuit. At choke resonance, the input impedance is very low, and since it is fed from a constant-voltage source, sensing device 15, the a-c current is very high and the voltage drop across $R_4$ is large. Thus the effect of $R_4$ will be very prominent at A cycles/sec, but will have very little effect on the $(A+150)$ cycles/sec gain. This provides an excellent gain control for the low-frequency peak.

The series-resonant circuit also provides the needed low-frequency cutoff. It forms a low-frequency filter whose attenuation increases with a decrease in the frequency of the input voltage. Sharpness of low-frequency cutoff can be seen from FIG. 2. Here the frequency change from A cycles/sec to $A-65$ cycles/sec gives an average gain reduction of approximately 77%.

Positive feedback is used to form the second peak at B (equals $A+150$) cycle/sec. For this frequency, the feedback network is designed to have a phase shift of 180°. This feeds a voltage back across the $R_5-C_3$ impedance which is in phase with the input voltage, and thus serves to increase the gain of the amplifier at that frequency. At higher frequencies the phase shift is small and the attenuation less, so that a strong out-of-phase signal is fed back to the input, thus greatly reducing the gain of the amplifier. At low frequencies, the phase shift is much greater than 180° so that the effect of the feedback is again to reduce the gain. However, at the low frequencies, the attenuation of the feedback network is so large that its effect is small, and the low-frequency response of the amplifier is practically the same as it would be without feedback. This is of no consequence since the input circuit provides the necessary low-frequency cutoff.

It has been found that the regeneration factor should be no greater than 2.5 if any degree of stability is to be attained. That is, the gain with feedback should not be more than 2.5 times that without feedback.

The condenser $C_9$ in the grid circuit of the thyratron is to remove any d-c surge which may occur when the fuse is armed and plate voltage is applied to the thyratron. It also provides some high-frequency attenuation in conjunction with the series grid resistor $R_{11}$.

Figure 3:
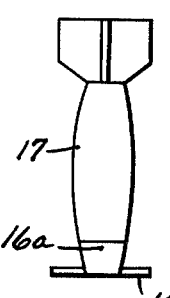
FIG. 3 is a side elevational view of an explosive missile in which is incorporated an electronic proximity fuse employing the amplifier of the invention.

The frequency-response curve M shown in FIG. 2 is a typical amplifier response for my circuit. Data for this curve were taken from a production unit, and show one having ideal shaping. The maximum gain factor is 125 at A cycles/sec and the response curve is flat from A to B cycles/sec within ±1 db. Over the same frequency band, the firing voltage, that is, the voltage required to fire a typical thyratron 2 with 8 volts of holding bias, is 36±2 mv. The Thyratron 2 has a detonator 18 connected in its plate circuit which in response to a pulse in said plate circuit when the thyratron is triggered by the amplifier of the invention causes detonation of an explosive charge, for example, a charge in a bomb such as indicated by 17 in FIG. 3 wherein the nose member 16a of the bomb may house the sensing device, amplifier of the invention and associated circuitry, including the detonator 18. It will be noticed that the low-frequency gain at C cycle/sec is only 30% of the peak gain, and the high-frequency gain at D cycle/sec is also very low. Thus all the general requirements are met by the amplifier.

The shape of the amplifier-response curve within the band-pass region does exert some influence on the proper functions for varying conditions. The amplifier is so designed that the shaping of the band-pass region can be controlled in production by proper adjustment of two components. These are $R_4$ and $C_8$ which control the low and high-frequency gain, respectively.

Increasing the value of $R_4$ causes an increased voltage drop to the choke, resulting in lower gain at the choke resonant frequency. Curves P and Q of FIG. 2, taken with the feedback network disconnected, show that increasing $R_4$ about 50% reduces the gain about 12% at the choke peak, and has little effect elsewhere. This increase also has some interaction with the high-frequency peak gain since use of it increases the input impedance, thus raising the effectiveness of the feedback circuit.

The high-frequency peak gain is controlled by negative feedback through condenser $C_8$ which is a small "variable" type condenser. Decreasing the value of $C_8$ will increase the high peak gain since the amount of degeneration is then decreased. Resistor $R_{11}$ isolates $C_8$ from the feedback network so a change in $C_8$ will affect only the gain and not the peak frequency of the network.

Curves N and M of FIG. 2 show how the shape of the band-pass region can be altered by adjustment of $C_8$ and use of $R_4$. Both curves are of the same unit with different settings. Curve N is with resistor $R_4$ set high and $C_8$ adjusted until the maximum gain factor is 130. Curve M is with $R_4$ set low and $C_8$ readjusted for a gain factor of 130. It will be noted that curve M is much flatter and has the more ideal shape over the band-pass region, and that the very low-and-high-frequency response is unaffected by changes of $R_4$ and $C_8$.

Complete r-f by-passing must be used to prevent any radio-frequency voltage from appearing on the grid of the amplifier pentode. Reductions as high as 40% have been noted when insufficient or incorrect by-passing and shielding were used. Use of two condensers $C_4$ in the pentode grid circuit (see FIG. 1) has eliminated any r-f signal from appearing in the audio amplifier. It should be noted that these two condensers by-pass the grid to each side of the filament above $R_{23}$ and $R_{24}$ and not to ground.

It will be apparent that the embodiments shown are only examplary and that various modifications can be made in construction and arrangement within the scope of my invention as defined in the appended claims.

I claim:

1. An audio frequency amplifier selectively responsive to a band of Doppler frequencies comprising an electron tube having at least grid, anode and cathode elements, a three pi network connecting said electron tube anode and grid elements, said network providing in-phase feedback producing maximum gain at peak high frequency of said Doppler band, an output circuit for said audio frequency amplifier, an input circuit for said audio frequency amplifier, a high frequency peak gain control comprising a capacitor coupling said output circuit and grid element of said electron tube, said gain control producing negative feedback and thereby controlling the high frequency peak gain of said audio frequency amplifier, an isolating resistor in series with said capacitor and said output circuit, said isolating resistor functioning to isolate said capacitor from said network so that a change in said capacitor will affect only the gain and not the peak frequency of said network, said input circuit including input terminals, a variable resistor, capacitor and inductor series connected across said input terminals, and means connecting the grid-cathode circuit of said electron tube across said inductor, whereby frequencies below the low frequency end of said band are sharply surpressed, variable said resistor being adjustable to increase the impedance of said input circuit and thereby interact with the said peak high frequency gain to increase the effectiveness of said network.

2. In combination with an object sensing device in which is generated a band of Doppler frequencies, a low-frequency band-pass amplifier comprising an amplifier electron tube having anode, control grid and cathode elements, an input circuit for said tube variable resistor having one terminal connected to a including a series resonant means comprising a choke and coupling condenser, a resistor coupling said grid element with the juncture of said choke and coupling condenser, the choke being in shunt relationship with said grid and cathode elements said means sharply suppressing frequencies below the low frequency limit of said band, said variable resistor having its opposite terminal connected to said sensing device, an output circuit connected to said anode, and a phase shifting filter network connecting said output circuit to said grid, said network providing in-phase feedback producing maximum gain at the high-frequency end of said band and out-of-phase feedback at higher frequencies to sharply suppress such frequencies in the output circuit, a negative feedback control comprising a variable capacitor connecting said grid with said output, capacitor adjustable for desired gain factor and slope of the band-pass region of said amplifier said variable resistor adjustable to increase the impedance of said input and thereby interacting with said network to increase its effectiveness.

* * * * *